(12) United States Patent
Liu et al.

(10) Patent No.: US 9,764,986 B2
(45) Date of Patent: Sep. 19, 2017

(54) LOW TEMPERATURE CVD COATINGS AND APPLICATIONS THEREOF

(71) Applicant: Kennametal Inc., Latrobe, PA (US)

(72) Inventors: Zhenyu Liu, Greensburg, PA (US); Qingjun Zheng, Export, PA (US); Peter Rudolf Leicht, Latrobe, PA (US); Yixiong Liu, Greensburg, PA (US)

(73) Assignee: KENNAMETAL INC., Latrobe, PA (US)

( * ) Notice: Subject to any disclaimer, the term of this patent is extended or adjusted under 35 U.S.C. 154(b) by 184 days.

(21) Appl. No.: 14/602,745

(22) Filed: Jan. 22, 2015

(65) Prior Publication Data

US 2016/0215387 A1    Jul. 28, 2016

(51) Int. Cl.
*C23C 16/34*    (2006.01)
*C04B 35/58*    (2006.01)

(52) U.S. Cl.
CPC ........ *C04B 35/58014* (2013.01); *C23C 16/34* (2013.01)

(58) Field of Classification Search
USPC .......... 51/307, 309; 428/336, 698, 699, 701, 428/702
See application file for complete search history.

(56) References Cited

U.S. PATENT DOCUMENTS

| | | | |
|---|---|---|---|
| 5,467,670 A | 11/1995 | Alverio | |
| 5,554,415 A | 9/1996 | Turchan et al. | |
| 5,704,787 A * | 1/1998 | Hickok | A61C 17/20 433/119 |
| 5,915,162 A | 6/1999 | Uchino et al. | |
| 6,274,206 B1 | 8/2001 | Turchan et al. | |
| 6,379,798 B1 | 4/2002 | Yazaki | |
| 6,482,476 B1 | 11/2002 | Liu | |
| 7,544,024 B2 | 6/2009 | Omori et al. | |
| 7,553,113 B2 | 6/2009 | Omori et al. | |
| 7,655,293 B2 * | 2/2010 | Ljungberg | B24C 1/08 51/307 |
| 8,003,234 B2 | 8/2011 | Omori et al. | |
| 2002/0076284 A1 | 6/2002 | Kato | |
| 2005/0276990 A1 | 12/2005 | Kohara et al. | |
| 2007/0087211 A1 | 4/2007 | Endres | |
| 2007/0166545 A1 * | 7/2007 | Tanibuchi | B23B 27/141 428/408 |
| 2007/0248424 A1 | 10/2007 | Omori et al. | |
| 2007/0284255 A1 | 12/2007 | Gorokhovsky et al. | |
| 2008/0131218 A1 | 6/2008 | Omori et al. | |

(Continued)

OTHER PUBLICATIONS

Aguero et a "A low Temperatur CVD process for TiN coatings" Mat. Res. Soc. Symp. Proc. vol. 168 (1990) p. 311-316.*

(Continued)

*Primary Examiner* — Archene Turner
(74) *Attorney, Agent, or Firm* — Larry R. Meenan

(57) ABSTRACT

In one aspect, articles employing CVD coatings deposited at low temperatures are described herein. Briefly, a coated article described herein comprises a substrate and a refractory coating adhered to the substrate, the refractory coating including a layer of TiN deposited by thermal CVD, the layer of TiN having an average crystallite size of 0.05 μm to 0.5 μm and residual tensile stress of 100 MPa to 700 MPa.

20 Claims, 4 Drawing Sheets

(56) References Cited

U.S. PATENT DOCUMENTS

| | | |
|---|---|---|
| 2008/0152944 A1 | 6/2008 | Bonini et al. |
| 2008/0260477 A1 | 10/2008 | Omori et al. |
| 2009/0044415 A1 | 2/2009 | Fujino et al. |
| 2012/0006785 A1 | 1/2012 | Gorokhovsky et al. |
| 2013/0216777 A1 | 8/2013 | Jiang et al. |
| 2014/0124098 A1 | 5/2014 | Duttlinger et al. |
| 2014/0308083 A1 | 10/2014 | Bjormander |

OTHER PUBLICATIONS

Park et al "Improvement of the biocompatibilty and mechanical properties of surgical tool with TiN coating by PACVD" Thin Solid Films 435 (2003) p. 102-107.*

Ma et al "Parametric effect of residual stress in ulsed d.c. plasma enhanced CVD TiN coatings" Surf & coatin Tech 142-144 (2001) p. 1023-1027.*

Wagner, J., et al., "The effect of deposition temperature on microstructure and properties of thermal CVD TiN coatings", ScienceDirect, International Journal of Refractory Metals & Hard Materials 26 (2008) pp. 120-126.

Rebenne, Helen E., et al., "Review of CVD TiN coatings for wear-resistant applications: deposition processes, properties and performance*", Surface and Coatings Technology, 63 (1994), pp. 1-13.

Temple-Boyer, P., et al., Residual stress in low pressure chemical vapor deposition SiNx films deposited from silane and ammonia, J. Vac. Sci. Technol. A 16(4), Jul./Aug. 1998, 1998 American Vacuum Society, pp. 2003-2007.

Crook, Paul, Haynes International, Inc., Corrosion of Nickel and Nickel-Base Alloys, ASM Handbook, vol. 13B: Corrosion: Materials, pp. 228-251.

ASM Specialty Handbook, Tool Materials, Cobalt-Base Alloys, pp. 32-34.

* cited by examiner

LOW TEMPERATURE CVD COATINGS AND APPLICATIONS THEREOF

FIELD

The present invention relates to refractory coatings deposited at low temperatures by chemical vapor deposition (CVD) and, in particular, to titanium nitride (TiN) coatings deposited by low temperature CVD.

BACKGROUND

Refractory coatings are often employed to enhance wear resistance, corrosion resistance, performance and/or lifetime of various tooling and machinery. TiN, TiC, TiCN and $Al_2O_3$, for example, have been applied to tooling surfaces by CVD and physical vapor deposition (PVD). In many applications, TiN is applied to tooling and machinery by PVD. However, PVD techniques suffer a significant disadvantage in that they can only coat surfaces in line-of-sight from the source. Further, PVD techniques generally suffer from low coating growth rates. These disadvantages render difficult the efficient and complete coating of parts having complex geometries, resulting in low product yield.

CVD techniques are largely unrestricted by line-of-sight requirements and provide conformal coverage with higher growth rates and higher loading factors. Nevertheless, CVD techniques generally require high temperatures unsuitable for many heat-treated metal or alloy substrates. Exposure of heat-treated substrates to high CVD temperatures can degrade mechanical properties of the substrate and induce undesirable structural or phase transitions in the metal or alloy.

SUMMARY

In one aspect, articles employing CVD coatings deposited at low temperatures are described herein. In being deposited at low temperatures, such CVD coatings can be applied to a wide variety of metal and alloy substrates without altering mechanical and/or structural properties of the substrates. Briefly, a coated article described herein comprises a substrate and a refractory coating adhered to the substrate, the refractory coating including a layer of TiN deposited by thermal CVD, the layer of TiN having an average crystallite size of 0.05 µm to 0.5 µm and residual tensile stress of 100 MPa to 700 MPa. As described further herein, the TiN layer, in some embodiments, is deposited directly on the substrate surface and exhibits residual tensile stress of 100 MPa to 700 MPa in the as-deposited state.

In another aspect, methods of making coated articles by low-temperature CVD techniques are described herein. A method comprises providing a substrate and depositing a refractory coating over the substrate, the refractory coating including a layer of TiN having an average crystallite size of 0.05 µM to 0.5 µm and residual tensile stress of 100 MPa to 700 MPa, wherein the TiN layer is deposited by thermal CVD in a reactor from a gaseous mixture comprising a titanium source and a nitrogen source at a temperature of 350° C. to 750° C.

These and other embodiments are described in greater detail in the detailed description which follows.

DETAILED DESCRIPTION

Figure 1:
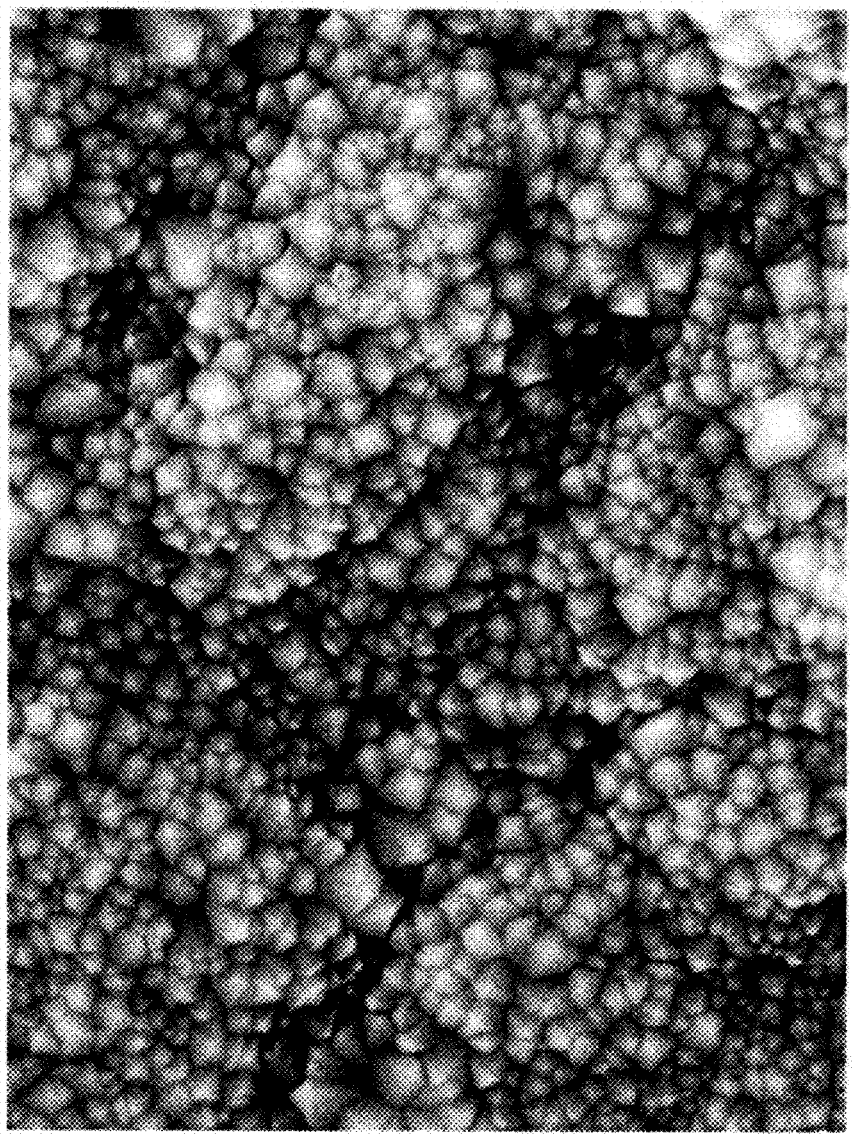
FIG. 1 is a plan view scanning electron microscopy (SEM) image of a low-temperature CVD TiN coating according to one embodiment described herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

In one aspect, articles employing CVD coatings deposited at low temperatures are described. A coated article described herein comprises a substrate and a refractory coating adhered to the substrate, the refractory coating including a layer of TiN deposited by thermal CVD, the layer of TiN having an average crystallite size of 0.05 µm to 0.5 µm and residual tensile stress of 100 MPa to 700 MPa.

Turning now to specific components, coated articles described herein comprise a substrate. A coated article can comprise any substrate not inconsistent with the objectives of the present invention. For example, a substrate can be a cutting tool or tooling/components used in wear applications. Cutting tools include, but are not limited to, indexable cutting inserts, end mills or drills. Indexable cutting inserts can have any desired ANSI standard geometry for milling or turning applications. Substrates of coated articles described herein can be formed of cemented carbide, carbide, ceramic, cermet, alloy or steel. A cemented carbide substrate, in some embodiments, comprises tungsten carbide (WC). WC can be present in a substrate in an amount of at least about 80 weight percent or in an amount of at least about 85 weight percent. Additionally, metallic binder of cemented carbide can comprise cobalt or cobalt alloy. Cobalt, for example, can be present in a cemented carbide substrate in an amount ranging from 1 weight percent to 30 weight percent. In some embodiments, cobalt is present in a cemented carbide substrate in an amount ranging from 5-15 weight percent or from 6-10 weight percent. Further, a cemented carbide substrate may exhibit a zone of binder enrichment beginning at and extending inwardly from the surface of the substrate.

Cemented carbide substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can comprise one or more solid solution carbides in an amount ranging from 0.1-5 weight percent. Additionally, a cemented carbide substrate can comprise nitrogen.

Alternatively, substrates include metal or alloy substrates. In some embodiments, metal or alloy substrates are heat treated to induce one or more mechanical and/or structural characteristics. Heat treating processes for metal and alloy substrates can include normalizing, annealing, stress relieving, austenitizing, quenching and/or tempering. A substrate, for example, can be a heat treated tool steel. Heat treated tool steels, in some embodiments, are selected from molybdenum high-speed steels, tungsten high speed steels, chromium hot work steels, molybdenum hot work steels and tungsten hot work steels. Alloy substrates also include iron-based alloys, nickel-based alloys, cobalt-based alloys and steels.

In further embodiments, substrates include ceramics and polycrystalline cubic boron nitride (PcBN). Suitable ceramic materials can include silicon nitride, silicon aluminum oxynitride (SiAlON), silicon carbide, silicon carbide whisker containing alumina or mixtures thereof.

As described herein, a refractory coating adhered to the substrate comprises a layer of TiN deposited by thermal CVD, the layer of TiN having an average crystallite size of 0.05 µm to 0.5 µm and residual tensile stress of 100 MPa to 700 MPa. The TiN layer can be deposited directly on the substrate surface and exhibit residual tensile stress of 100 MPa to 700 MPa in the as-deposited state. The low deposition temperatures, in some embodiments, can mitigate tensile stresses induced by differences in coefficients of thermal expansion (CTE) between the TiN layer and substrate. For example, a TiN layer can be deposited directly on a cemented carbide substrate and exhibit residual tensile stress of 100 MPa to 700 MPa in the as-deposited state.

Additionally, the low deposition temperatures can also ease tensile stresses formed in the substrate adjacent to the TiN layer. In some embodiments, a substrate can exhibit tensile stress of 50 MPa to 300 MPa at a depth within 2 µm of the interface with the TiN layer. For example, a cemented carbide substrate can have residual tensile stress of 50 MPa to 300 MPa within 2 µm of the interface with the TiN layer. Reduction of residual tensile stress in the TiN coating and/or substrate can enhance coating adhesion and resist delamination and chipping mechanisms. Further, substrate surfaces to be coated can be provided one or more pre-coating treatments including blasting, wet-blasting and/or sonication cleaning. Such treatments can increase surface roughness leading to additional enhancement to coating adhesion. For example, in some embodiments, a low-temperature CVD TiN layer described herein can exhibit a critical load ($L_c$) greater than 60 N or greater than 70 N. $L_c$ values for coatings recited herein are determined according to ASTM C1624-05—Standard Test for Adhesion Strength by Quantitative Single Point Scratch Testing wherein a progressive loading rate of 10 N/mm is used. In such embodiments, the low-temperature CVD TiN layer can be deposited directly on the substrate surface. Alternatively, the low-temperature CVD TiN layer may exhibit ($L_c$) greater than 60 N or 70 N when deposited over one or more inner layers of the refractory coating.

For TiN refractory layers described herein, residual stress and shear stress were determined by x-ray diffraction using the grazing incidence $Sin^2 \psi$ method with reference to multiple (hkl) reflections of the TiN crystalline phase. Instrumentation used for residual stress determination was a PANalytical Xpert Pro MRD fitted with an Eulerian cradle for specimen manipulation. The x-ray source was a copper long fine focus x-ray tube operating at 45 kV and 40 mA. The instrument was configured with parallel beam optics for the determination of the stress in the coatings. The incident optics included an x-ray mirror with 1/16 degree antiscatter slit and 0.04 soller slit. The receiving optics included a 0.27 degree parallel plate collimator, a flat graphite monochromator and a sealed proportional counter.

The (111), (200), (220), (311), (222), (331), (420), and (422) reflections of TiN were selected for the measurement of the residual stress levels. The grazing incidence angle was selected to minimize the substrate reflections while insuring that entire refractory layer thickness is included in the analysis. Data collection parameters for step size and count time were adjusted for each (hkl) reflection to obtain adequate peak intensity for accurate determination of peak position.

Peak data was then corrected for Absorption and Transparency using the following equations:

Absorption Correction $$A = \left[1 - \frac{\tan(\omega - \theta)}{\tan\theta}\right] \times \left[1 - e^{\left(-\upsilon\tau \times \frac{2\sin\theta \times \cos(\omega-\theta)}{\sin^2\theta - \sin^2(\omega-\theta)}\right)}\right]$$

Transparency Correction $$\Delta 2\theta = \frac{180}{\pi} \times \frac{2\tau}{R} \times \frac{\sin(\theta)\cos(\theta)}{\sin(\omega)}$$

$$\text{with } \tau = \frac{t}{\beta} \times \frac{(1-\beta) \times e^{-\beta} - e^{-\beta}}{1 - e^{-\beta}}$$

$$\text{and } \beta = \frac{2\mu t \sin\theta \times \cos(\omega - \theta)}{\sin^2\theta - \sin^2(\omega - \theta)}$$

where:
t=thickness of layer
µ=linear absorption coefficient ($cm^{-1}$)
θ=2Theta/2 (degrees)
(ω–θ)=omega offset angle (degrees)
ψ=tilt angle (Psi stress) (degrees)
τ=information depth (microns)
R=Radius of goniometers (mm)

The peak data was corrected for Lorentz polarization using the following equation:

Polarization Correction $$LP = \frac{\cos^2 2\theta_{mon} \times \cos^2 2\theta}{\sin\theta}$$

$2\theta_{mon}$=diffraction angle of graphite monochromator

The $K\alpha_2$ peaks were removed using the Ladell model. Peak positions were refined using a modified Lorentzian shape profile function.

The refractory layer residual stress was calculated from the general equation:

$$\frac{d_{\varphi\psi} - d_0}{d_0} = S_1(\sigma_1 + \sigma_2) + \frac{1}{2}S_2\sigma_\varphi \sin^2\psi$$

where $\sigma_\phi = \sigma_1 \cos^2 \phi + \sigma_2 \sin^2 \phi$
$d_{\phi\psi}$=lattice constant at angle φ and tilt ψ
$d_0$=strain free lattice constant
φ=rotation angle
ψ=specimen tilt
$\sigma_1$ & $\sigma_2$=primary stress tensors in specimen surface
$\sigma_\phi$=stress at φ rotation angle
$S_1$ & ½ $S_2$=X-ray elastic constants $$S_1 = \frac{-\upsilon}{E} \quad \frac{1}{2}S_2 = \frac{1+\upsilon}{E}$$

For the present TiN analysis Poisson's Ratio (υ) was set to 0.25, and the elastic modulus (E in GPa) was determined from nano-indentation analysis conducted with a Fischerscope HM2000 in accordance with ISO standard 14577 using a Vickers indenter. Indentation depth was set to 0.20 μm. Residual stress analysis by XRD can be performed in a similar manner for the substrate. For example, residual stress of a cemented carbide substrate can be determined in a similar manner employing the (001), (100), (101), (111), (211) and (300) WC reflections, and elastic modulus is determined according to nano-indentation.

In addition to reduced levels of residual tensile stress, the low-temperature CVD TiN layer can have hardness of 1500 HV to 2500 HV. Hardness is determined as detailed above with a Fischerscope HM2000 in accordance with ISO standard 14577 using a Vickers indenter. Indentation depth is set to 0.20 μm. In some embodiments, the TiN layer has a hardness selected from Table I.

TABLE I

| Low-Temperature TiN Hardness (HV) |
|---|
| 1700-2500 |
| 1800-2500 |
| 1700-2000 |
| 1900-2300 |

TiN layers of coated articles described herein can also exhibit one or more preferred orientations as characterized by texture coefficient (TC). For example, a TiN layer deposited by low-temperature thermal CVD can have a TC greater than 3.5 for the (200) growth direction, the texture coefficient (TC) being defined as $$TC(hkl) = \frac{I(hkl)}{I_0(hkl)} \left\{ \frac{1}{n} \sum \frac{I(hkl)}{I_0(hkl)} \right\}^{-1}$$

where
I(hkl)=measured intensity of the (hkl) reflection
$I_0$(hkl)=standard intensity of the (hkl) reflection according to International Center for Diffraction Data (ICDD) card 38-1420
n=number of reflections used in the TC calculation
(hkl) reflections used in the TC calculation are (111), (200), (220), (311), (222), (400), (331) and (422). Further, TC for the (200) growth direction, in some embodiments, is at least 4 or 4.3.

The peak data for calculation of the TC of low-temperature CVD TiN described herein was measured on a PANalytical Xpert MPD system fitted with Bragg parafocusing optics. The divergence side optics include a programmable divergence slit, 0.02 radian soller slit and fixed antiscatter slit. The receiving side optics include a programmable antiscatter slit, 0.02 radian soller slit and a silicon based position sensitive detector.

The peak data is collected using the programmable divergence slit in variable slit mode. This is to insure the analysis of a constant irradiated volume of coating throughout the data collection scan. The irradiated length is selected to insure the analyzed surface area is within the specimen surface. The fixed antiscatter slit size is determined by the irradiated length and the analyzed width is controlled by a fixed beam mask.

The receiving side programmable antiscatter slit is also set to variable slit mode and the length is set to match the programmable divergence slit length. The silicon position sensitive detector is set to scanning mode. The scan step size is selected to insure a minimum of 10 steps across the peak full width at half max (FWHM), and the count time is set to collect approximately 10,000 total counts on the most intense peak.

The collected diffraction data is first converted from the variable (automatic) slit data to fixed slit data using the algorithm:

$$IFDS(\theta, \alpha) = IADS(\theta, L) * \left( \frac{R * \mathrm{Sin}(\alpha/2)}{L} \right) * \left( \frac{1}{\mathrm{Sin}(\theta + \alpha/2)} + \frac{1}{(\mathrm{Sin}(\theta - \alpha/2))} \right)$$

where:
L=length of beam on the specimen in mm
R=radius of the goniometer in mm
α=divergence angle of the variable slit
Θ=angle between source and specimen
After the data is converted to fixed slit data, a background profile is determined Preliminary peak position and peak intensity is determined. Precise peak position and intensity is determined by fitting a pseudo-Voigt profile to the collected diffraction data where the profile fit strips the Kα² peak. The TiN peak intensity is then corrected for the film thickness using the formula.
A(T)=Thin film correction factor for the reflection at angle T (Theta)

$$A = 1 - \exp\left(\frac{-2ut}{\mathrm{Sin}T}\right)$$

u=linear attenuation coefficient for TiCN under copper radiation
t=film thickness in microns
Sin(T)=theta angle of the TiN reflection
The intensity data corrected for film thickness is used in the TC calculation.

TiN layers deposited by low-temperature thermal CVD can have any thickness not inconsistent with the objectives of the present invention. A TiN layer, for example, can have a thickness of 1 μm to 200 μM. In some embodiments, thickness of a TiN layer is selected from Table II.

TABLE II

| Low Temperature CVD TiN Layer Thickness (μm) |
|---|
| 2-100 |
| 5-100 |
| 3-50 |
| 1-10 |
| 0.5-5 |

As described herein, TiN layers deposited by low-temperature thermal CVD have an average crystallite size of 0.05 μm to 0.5 μm. In some embodiments, a TiN layer has an average crystallite size of 0.1 μm to 0.3 μm. As detailed in the examples discussed below, average crystallite size is determined by XRD analysis. Crystallite or grain size determination by XRD is the result of ascertaining the integral peak width and peak shape of the diffracted sample pattern. The analysis of grain size by the Rietveld method is based on the change of the parameters to determine the sample peak profile compared to a standard peak profile. The profile parameters depend on the instrument settings used for data collection and on the profile function used for refinement.

XRD analysis is completed using a grazing incidence technique and XRD instrumentation described for the residual stress analysis. A size-strain standard is first measured. NIST standard SRM 660b Line Position and Line Shape Standard for Powder Diffraction is used for this purpose. A high quality scan is obtained for the standard (e.g. >140 degrees 2θ) with optics tuned for resolution. The standard structure is loaded and refined. Typical Rietveld refinement parameter settings are:

Background calculation method: Polynomial
Sample Geometry: Flat Plate
Linear Absorption Coefficient: Calculated from average specimen composition
Weighting Scheme: Against $I_{obs}$
Profile Function: Pseudo-Voigt
Profile Base Width: Chosen per specimen
Least Squares Type: Newton-Raphson The Rietveld refinement for crystallite size depends on the profile function used to identify the peaks and typically includes:

U parameter describes peak FWHM
V parameter describes peak FWHM
W parameter describes peak FWHM
Peak Shape 1 describes the peak shape function parameter
Peak Shape 2 describes the peak shape function parameter
Peak Shape 3 describes the peak shape function parameter
Asymmetry describes peak asymmetry for the Rietveld or Howard Model Refinement of the standard defines the peak profile parameters strictly due to the instrument. This refinement is saved as the instrument peak broadening standard. The unknown sample data is imported into this standard refinement and then has peak profile refinement completed using the same parameters as the size standard. The results of the refinement of the peak profiles on the unknown sample determine the crystallite size.

Figure 2:
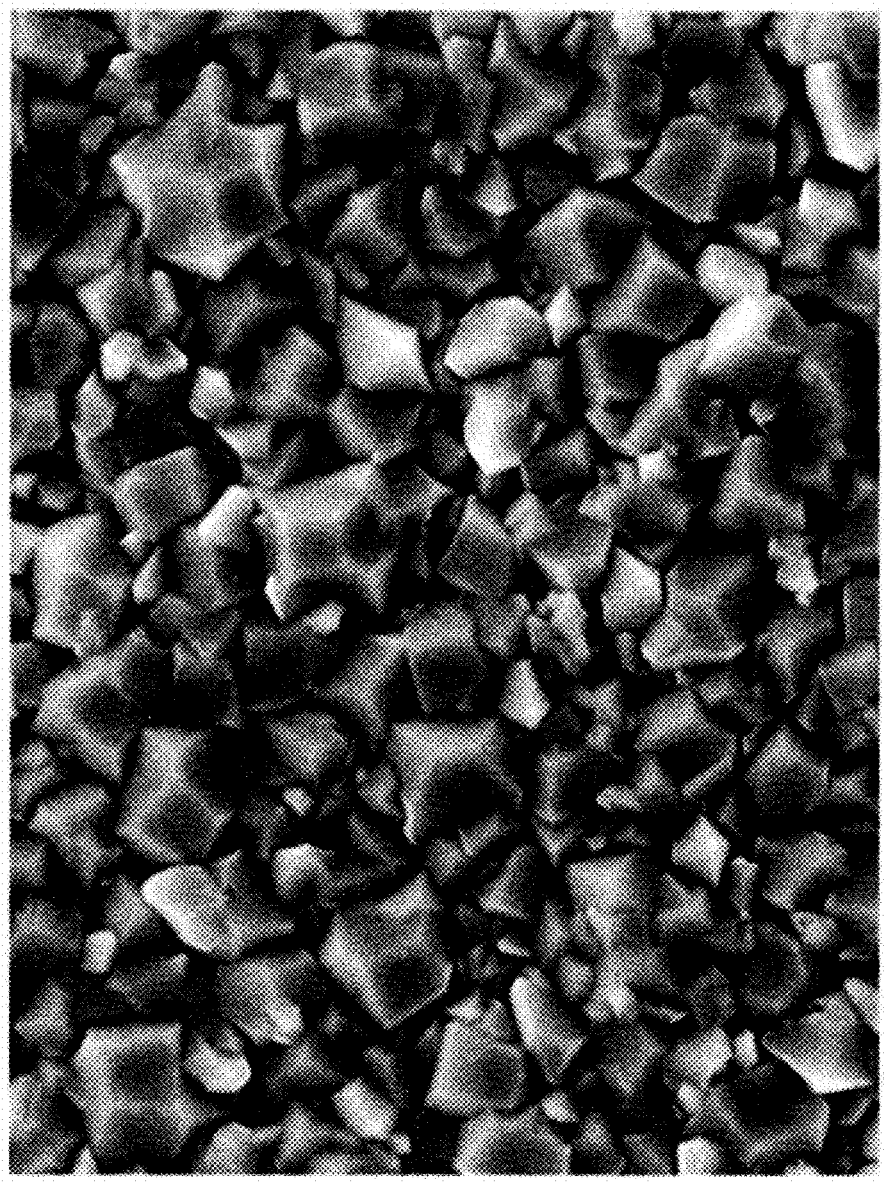
FIG. 2 is a plan view SEM image of a conventional high-temperature CVD TiN coating.

Additionally, as illustrated in FIG. 1, a low-temperature CVD TiN layer described herein can exhibit tetragonal pyramid crystalline grain morphology. Such grain morphology at the coating surface contrasts sharply with the polygonal surface morphology of conventional high temperature CVD TiN illustrated in FIG. 2. Moreover, crystallite size of the high temperature CVD TiN was significantly larger than the low-temperature CVD TiN of FIG. 1. In some embodiments, average crystallite size of a low-temperature CVD TiN layer described herein can be determined from SEM. If desired, SEM analysis can be used in conjunction with XRD techniques described herein for average crystallite size determination.

A TiN layer of a refractory coating can be deposited by low-temperature thermal CVD directly on the substrate surface, thereby forming an interface with the substrate. Alternatively, the refractory coating of the article comprises one or more inner layers between the low-temperature CVD TiN layer and substrate. Inner layer(s), in some embodiments, comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. In some embodiments, one or more inner layers between the substrate and TiN layer comprise a carbide, nitride, carbonitride, oxycarbonitride, oxide or boride of one or more metallic elements selected from the group consisting of aluminum and metallic elements of Groups IVB, VB and VIB of the Periodic Table.

The TiN layer deposited by low-temperature thermal CVD can be the outermost layer of the refractory coating. In such embodiments, the TiN layer can be the sole layer of the refractory coating or can be deposited over one or more inner layers Alternatively, the refractory coating can comprise one or more outer layers over the low-temperature CVD TiN layer. Outer layer(s) can comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. Outer layer(s) over the TiN layer can comprise a carbide, nitride, carbonitride, oxycarbonitride, oxide or boride of one or more metallic elements selected from the group consisting of aluminum and metallic elements of Groups IVB, VB and VIB of the Periodic Table. For example, one or more outer layers are selected from the group consisting of titanium carbonitride, titanium oxycarbonitride, titanium carbide, zirconium nitride, zirconium carbonitride, hafnium nitride, hafnium carbonitride and alumina and mixtures thereof.

Outer layers of coatings described herein can have any thickness not inconsistent with the objectives of the present invention. A coating outer layer, in some embodiments, can have a thickness ranging from 0.2 μm to tens or hundreds of microns.

In another aspect, methods of making coated articles are described herein. A method of making a coated article, for example, comprises providing a substrate and depositing a refractory coating over the substrate, the refractory coating including a layer of TiN having an average crystallite size of 0.05 μm to 0.5 μm and residual tensile stress of 100 MPa to 700 MPa, wherein the TiN layer is deposited by thermal CVD in a reactor from a gaseous mixture comprising a titanium source and a nitrogen source at a temperature of 350° C. to 750° C. In some embodiments, the TiN layer is deposited at a reactor temperature of 400° C. to 650° C.

Turning to specific components, suitable titanium source in the gaseous mixture can include titanium chloride. In some embodiments, titanium chloride is of the formula $TiCl_4$. As known to one of skill in the art, chloride stoichiometry can vary according to the oxidation state of titanium. $TiCl_2$, for example, may be employed as the titanium source in some embodiments. Moreover, suitable nitrogen source in the gaseous mixture can comprise ammonia, secondary amine and/or tertiary amine Secondary amines and tertiary amines can employ any alkyl and/or alkenyl moieties not inconsistent with the objectives of the present invention. In some embodiments, a secondary amine is dimethylamine, and a tertiary amine is trimethylamine. The nitrogen source and the titanium source can be present in the gaseous mixture in any ratio not inconsistent with the objectives of the present invention. For example, in some embodiments, a ratio of nitrogen source to titanium source ranges from 4:3 to 7:2.

The gaseous mixture in the CVD reactor can include additional components including hydrogen carrier gas and optional amounts of nitrogen, HCl and argon. General thermal CVD deposition parameters for a low-temperature TiN layer are provided in Table III.

TABLE III

LT-TiN CVD Deposition Parameters

| | |
|---|---|
| Temperature (° C.) | 350-750 |
| Pressure (torr) | 5-760 |
| Time (minutes) | 10-600 |
| $H_2$ | Balance |
| $N_2$ | 0-40 vol % |
| $TiCl_4$ | 0.1-2.0 vol. % |
| $NH_3$ or amine | 0.15-5 vol % |
| HCl | 0-3 vol. % |
| Ar | 0-5 vol. % |

Figure 3B:
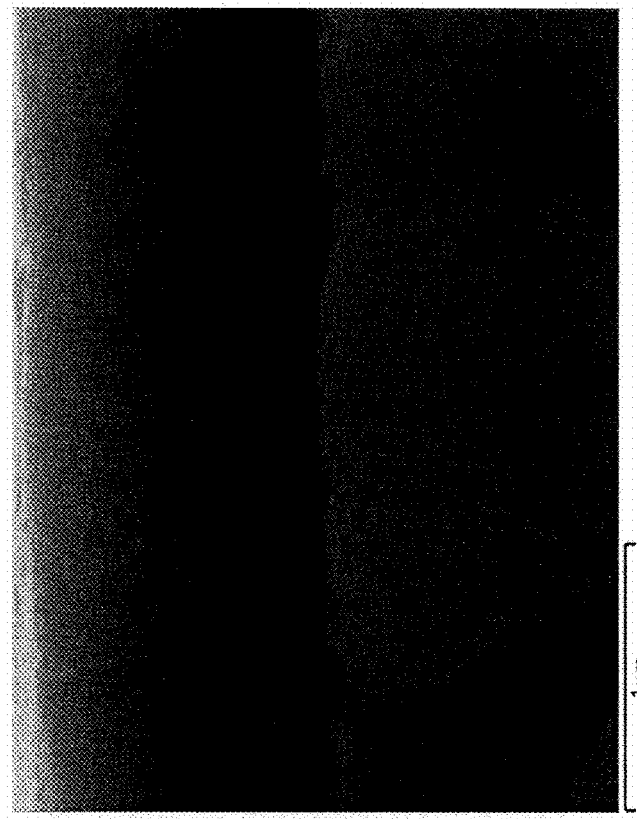
FIG. 3(a) is a cross-sectional SEM image of an article having a low-temperature CVD TiN coating deposited thereon according to one embodiment described herein and FIG. 3(b) is a sectional view of FIG. 3(a) taken at higher magnification.
Figure 3A:
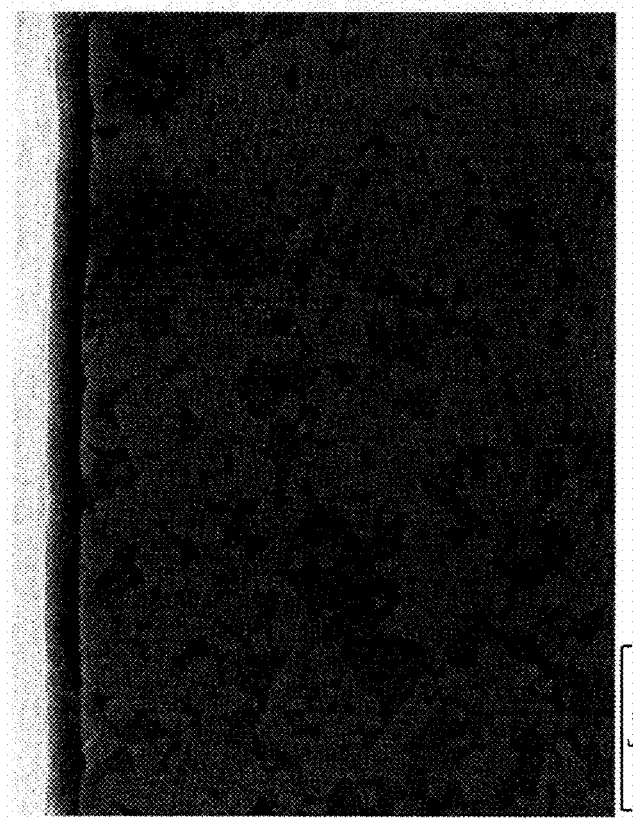

Deposition rate of the TiN layer under the low temperature thermal CVD conditions described herein can generally range from 0.2 m/hr to 5 μm/hr. Further, the TiN is deposited uniformly or substantially uniformly over the substrate surface. In being uniformly deposited, the TiN does not exhibit significant irregularities in thickness and/or structure along the substrate surface, as illustrated in FIGS. 3(a) and 3(b). Deposition can be administered for any time period to achieve desired thickness of the TiN layer. For example, deposition can be continued for a time period sufficient to provide a TiN layer having thickness of 1 μm to 200 μm.

If desired, the CVD reactor can employ a temperature gradient having lower temperature proximate a process gas entrance into the reactor and higher temperature distal from the entrance. For example, temperature proximate a process gas entrance can be 10° C. to 100° C. lower than reactor temperature at a point distal from the process gas entrance. In some embodiments, the temperature gradient ranges from 30° C. to 50° C. between a process gas entrance and distal point in the reactor. Further, a pre-heater can employed with the CVD apparatus in some embodiments. In such embodiments, the pre-heater can be set to a temperature of 200° C. to 400° C.

As described herein, the low-temperature CVD TiN layer can be deposited directly on the substrate surface. Alternatively, one or more refractory coating inner layers can reside between the substrate and TiN layer. General CVD deposition parameters for various inner layers are provided in Table IV.

TABLE IV

CVD Parameters for Inner layer Deposition

| Base Layer Composition | Gas Mixture | Temperature ° C. | Pressure mbar | Duration min. |
|---|---|---|---|---|
| TiN | $H_2$, $N_2$, $TiCl_4$ | 800-900 | 60-100 | 10-90 |
| MT-TiCN | $H_2$, $N_2$, $TiCl_4$, $CH_3CN$ | 750-900 | 65-100 | 50-400 |
| HT-TiCN | $H_2$, $N_2$, $TiCl_4$, $CH_4$ | 900-1050 | 60-160 | 30-200 |
| TiOCN | $H_2$, $N_2$, $TiCl_4$, $CH_4$, CO | 900-1050 | 200-550 | 30-70 |

The foregoing general CVD parameters for inner layer deposition, in some embodiments, can be applied to deposition of one or more outer layers over the low temperature TiN layer.

These and other embodiments are further illustrated in the following non-limiting examples.

Example 1—Coated Articles

Cutting tools having a low-temperature CVD TiN layer described herein were produced by placing cemented tungsten carbide (WC—Co) cutting insert substrates [ANSI standard geometry SNMA432S104] into an axial flow hot-wall CVD reactor. The cutting inserts comprised 6 wt. % cobalt binder with the balance WC grains of size 1-5 μm. A refractory layer consisting of a single layer of TiN was deposited on the cutting inserts according to Table V.

TABLE V

Low Temperature TiN Deposition

| | |
|---|---|
| Temperature (° C.) | 520 |
| Pressure (torr) | 75 |
| Time (minutes) | 120 |
| $H_2$ | Balance |
| $N_2$ | 32 vol. % |
| $TiCl_4$ | 0.6 vol. % |
| $NH_3$ | 4.4 vol. % |
| HCl | optional |

A coated cutting insert was analyzed, and the resulting low-temperature CVD TiN layer exhibited the as-deposited properties provided in Table VI. Moreover, the cemented carbide substrate was also analyzed to determine post-coat residual stress at a depth within 2 μm of the interface with the TiN layer. The coated substrate residual stress is detailed in Table VII. Further, cross-sectional SEM images of a coated cutting insert according to this example are provided in FIGS. 3(a) and 3(b). As illustrated in FIGS. 3(a)-(b), the low-temperature CVD TiN layer was uniform in thickness over the substrate surface.

TABLE VI

Low Temperature CVD TiN Coating Properties

| | |
|---|---|
| Thickness (μm) | 1.1 |
| Residual Tensile Stress (MPa) | 596 |
| Shear Stress (MPa) | 7 |
| Hardness (HV) | 1942 |
| Avg. Crystallite Size (μm) | 0.142 |
| Modulus (GPa) | 536 |

TABLE VII

WC-Co Substrate Properties*

| | |
|---|---|
| Residual Tensile Stress (MPa) | 282 |
| Shear Stress (MPa) | 6 |

*within 2 μm of coating interface

Figure 4:
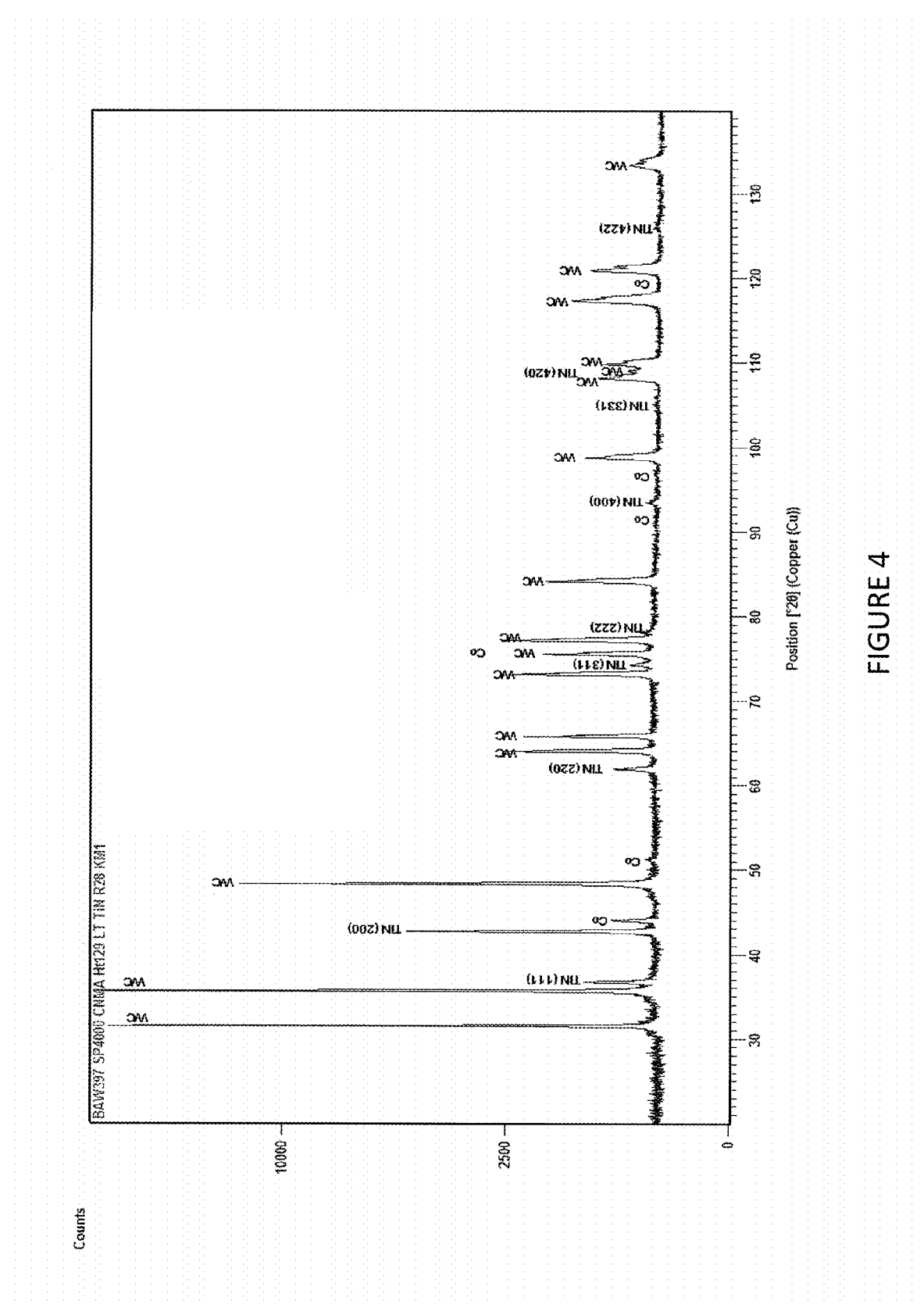
FIG. 4 is an X-ray diffractogram of a low-temperature CVD TiN coating according to one embodiment described herein.

TC of the low-temperature CVD TiN layer was also determined according to the procedures set forth hereinabove. FIG. 4 is the X-ray diffractogram employed in the TC analysis. TC was calculated for each reflection used in the analysis as set forth in Table VIII. Further, TC was also calculated with and without thin film thickness correction.

TABLE VIII

TC Analysis of Low Temperature CVD TiN Layer

| Thickness Correction | (h, k, l) Reflection | | | | | | | |
|---|---|---|---|---|---|---|---|---|
| | (111) | (200) | (220) | (311) | (222) | (400) | (331) | (422) |
| No | 0.84 | 4.40 | 0.66 | 0.81 | 0.28 | 0.51 | 0.28 | 0.22 |
| Yes | 0.83 | 4.37 | 0.66 | 0.81 | 0.28 | 0.51 | 0.29 | 0.23 |

As provided in Table VIII, the TiN layer exhibited a strong texture in the (200) direction.

Comparative coated cutting inserts of the same ANSI geometry and cemented carbide composition were provided a conventional TiN layer deposited by high temperature CVD. The high temperature TiN deposition parameters employed are provided in Table IX.

TABLE IX

| High Temperature CVD TiN Deposition | |
| --- | --- |
| Temperature (° C.) | 980 |
| Pressure (torr) | 75 |
| Time (minutes) | 80 |
| $H_2$ | Balance |
| $N_2$ | 25.6 vol. % |
| $TiCl_4$ | 0.8 vol. % |
| HCl | 0.6 vol. % |

A coated cutting insert was analyzed, and the resulting high-temperature CVD TiN layer exhibited the as-deposited properties provided in Table X. Moreover, the cemented carbide substrate was also analyzed to determine post-coat residual stress at a depth within 2 μm of the interface with the TiN layer. The coated substrate residual stress is detailed in Table XI.

TABLE X

| High Temperature CVD TiN Coating Properties | |
| --- | --- |
| Thickness (μm) | 4.8 |
| Residual Tensile Stress (MPa) | 2154 |
| Shear Stress (MPa) | 65 |
| Hardness (HV) | 1465 |
| Avg. Crystallite Size (μm) | >0.2 μm[†] |
| Modulus (GPa) | 549 |

[†]TiN crystallite size exceeded size limit of XRD technique

TABLE XI

| WC-Co Substrate Properties* | |
| --- | --- |
| Residual Tensile Stress (MPa) | 474 |
| Shear Stress (MPa) | 10 |

*within 2 μm of coating interface

As provided in Table X, the high-temperature CVD TiN displayed significantly higher residual tensile stress and substantially lower hardness. Reduced hardness in the high-temperature TiN layer may be attributable, in part, to the larger crystallite size. Crystallite size of the high-temperature TiN layer exceeded the maximum size detectable by XRD techniques described herein. Further, the cemented carbide substrate was adversely affected by the high temperature deposition, exhibiting much higher residual tensile stress in comparison with the cemented carbide substrate having the low-temperature TiN deposited thereon.

TC of the comparative high temperature CVD TiN layer was also determined according to the procedures set forth hereinabove. TC was calculated for each reflection used in the analysis as set forth in Table XII. Further, TC was also calculated with and without thin film thickness correction.

TABLE XII

TC Analysis of Low Temperature CVD TiN Layer

| Thickness Correction | (h, k, l) Reflection | | | | | | | |
| --- | --- | --- | --- | --- | --- | --- | --- | --- |
| | (111) | (200) | (220) | (311) | (222) | (400) | (331) | (422) |
| No | 1.47 | 1.90 | 1.51 | 1.69 | 0.00 | 0.00 | 0.00 | 1.44 |
| Yes | 1.46 | 1.88 | 1.50 | 1.68 | 0.00 | 0.00 | 0.00 | 1.49 |

As evidenced by Table XII, the high temperature CVD TiN layer exhibited a much less pronounced texture in the (200) growth direction in comparison to the low-temperature CVD TiN coating. The high-temperature CVD TiN layer also displayed competing preferred orientations in the (111), (220), (311) and (422) growth directions.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A coated article comprising:
   a substrate; and
   a refractory coating adhered to the substrate, the refractory coating including a layer of titanium nitride deposited by thermal chemical vapor deposition (CVD), the layer of titanium nitride having an average crystallite size of 0.05 μm to 0.5 μm and residual tensile stress of 100 MPa to 700 MPa.

2. The coated article of claim 1, wherein the titanium nitride layer has hardness of 1500 HV to 2500 HV.

3. The coated article of claim 1, the titanium nitride layer has a texture coefficient greater than 3.5 for the (200) growth direction, the texture coefficient (TC) being defined as $$TC(hkl) = \frac{I(hkl)}{I_0(hkl)} \left\{ \frac{1}{n} \sum \frac{I(hkl)}{I_0(hkl)} \right\}^{-1}$$

where
I(hkl)=measured intensity of the (hkl) reflection
$I_0$(hkl)=standard intensity of the (hkl) reflection according to International Center for Diffraction Data (ICDD) card 38-1420
n=number of reflections used in the TC calculation
(hkl) reflections used in the TC calculation are (111), (200), (220), (311), (222), (400), (331) and (422).

4. The coated article of claim 3, wherein the titanium nitride layer has a TC greater than 4.0.

5. The coated article of claim 1, wherein the substrate is selected from the group consisting of cemented carbide, ceramic and alloy.

6. The coated article of claim 1, wherein the titanium nitride layer forms an interface with the substrate.

7. The coated article of claim 6, wherein the substrate is cemented carbide, the cemented carbide substrate having residual tensile stress of 50 MPa to 300 MPa at a depth within 2 μm of the interface with the titanium nitride layer.

8. The coated article of claim 7, wherein the cemented carbide substrate has a pre-coat treated surface condition.

9. The coated article of claim 8, wherein the cemented carbide substrate has a blasted surface condition.

10. The coated article of claim 5, wherein the substrate is an alloy selected from the group consisting of steels, iron-based alloys, nickel-based alloys and cobalt-based alloys.

11. The coated article of claim 1, wherein the titanium nitride layer has a thickness of 1 μm to 200 μm.

12. The coated article of claim 1, wherein the titanium nitride layer has a thickness of 5 μm to 100 μm.

13. The coated article of claim 1, wherein the refractory coating further comprises one or more inner layers between the titanium nitride layer and the substrate, an inner layer comprising one or more metallic elements selected from the group consisting of aluminum and metallic elements of Groups IVB, VB and VIB of the Periodic Table and one or more non-metallic elements of Groups IIIA, VI, VA and VIA of the Periodic Table.

14. The coated article of claim 1, wherein the refractory coating further comprises one or more outer layers over the titanium nitride layer, an outer layer comprising one or more metallic elements selected from the group consisting of aluminum and metallic elements of Groups IVB, VB and VIB of the Periodic Table and one or more non-metallic elements of Groups IIIA, VI, VA and VIA of the Periodic Table.

15. The coated article of claim 1, wherein the substrate is a cutting tool.

16. The coated article of claim 1, wherein the substrate is a wear component.

17. The coated article of claim 1, wherein the layer of titanium nitride has a critical load ($L_c$) of at least 70 N.

18. The coated article of claim 1, wherein the titanium nitride crystallites exhibit a tetragonal pyramid grain morphology.

19. The coated article of claim 1, wherein the titanium nitride layer is in the as-deposited state.

20. The coated article of claim 1, wherein the substrate is selected from the group consisting of cemented carbide and ceramic.

* * * * *